US006429063B1

(12) United States Patent
Eitan

(10) Patent No.: US 6,429,063 B1
(45) Date of Patent: Aug. 6, 2002

(54) NROM CELL WITH GENERALLY DECOUPLED PRIMARY AND SECONDARY INJECTION

(75) Inventor: Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 09/519,745

(22) Filed: Mar. 6, 2000

Related U.S. Application Data
(60) Provisional application No. 60/161,596, filed on Oct. 26, 1999.

(51) Int. Cl.⁷ .......................................... H01L 21/8238
(52) U.S. Cl. .................. 438/232; 438/261; 365/185.03; 365/185.15; 365/185.29; 257/315
(58) Field of Search ................................. 438/232, 261; 365/185.15, 185.03, 185.29; 257/315

(56) References Cited

U.S. PATENT DOCUMENTS

| 3,895,360 | A | 7/1975 | Cricchi et al. .......... 365/230.03 |
| 4,016,588 | A | 4/1977 | Ohya et al. ................. 257/322 |
| 4,017,888 | A | 4/1977 | Christie et al. |
| 4,151,021 | A | 4/1979 | McElroy ..................... 438/257 |
| 4,173,766 | A | 11/1979 | Hayes ......................... 257/315 |
| 4,173,791 | A | 11/1979 | Bell ............................ 365/178 |
| 4,257,832 | A | 3/1981 | Schwabe et al. ............. 438/275 |
| 4,306,353 | A | 12/1981 | Jacobs et al. ................ 438/200 |
| 4,342,149 | A | 8/1982 | Jacobs et al. ................ 438/275 |
| 4,360,900 | A | 11/1982 | Bate ............................ 365/184 |

(List continued on next page.)

FOREIGN PATENT DOCUMENTS

| EP | 0751560 | 6/1995 |
| GB | 1297899 | 10/1970 |
| GB | 2157489 | 3/1984 |
| JP | 05021758 | 7/1991 |
| JP | 07193151 | 12/1993 |
| JP | 09162314 | 12/1995 |
| WO | WO 81/00790 | 9/1979 |
| WO | WO 96/25741 | 2/1995 |

OTHER PUBLICATIONS

J.-D. Bude, et al, "Secondary Electron Flash—A High Performance, Low Power Flash Technology for 0.35 $\mu$m and Below", IEDM 97, pp.

J.-D. Bude, et al., "EEPROM/Flash —3.0 V Drain Source Bias Hot Carrier Writing", IEDM 95, pp. 989–992.

(List continued on next page.)

Primary Examiner—Amir Zarablan
Assistant Examiner—Pho Luu
(74) Attorney, Agent, or Firm—Eitan, Pearl, Latzer & Cohen-Zedek

(57) ABSTRACT

A method of creating a nitride, programmable read only memory (NROM) cell includes the step of decoupling injection of channel hot electrons into a charge trapping layer of the NROM cell from injection of non-channel electrons into the charge trapping layer. The step of decoupling can include the step of minimizing the injection of the non-channel electrons into the charge trapping layer. Alternatively, it includes the step of minimizing the generation of the non-channel electrons. The present invention includes cells which have minimal injection of non-channel electrons therein.

30 Claims, 14 Drawing Sheets

U.S. PATENT DOCUMENTS

| | | | |
|---|---|---|---|
| 4,380,057 A | 4/1983 | Kotecha et al. | 365/184 |
| 4,471,373 A | 9/1984 | Shimizu et al. | 257/315 |
| 4,521,796 A | 6/1985 | Rajkanan et al. | |
| 4,527,257 A | 7/1985 | Cricchi | 365/184 |
| 4,630,085 A | 12/1986 | Koyama | 257/315 |
| 4,667,217 A | 5/1987 | Janning | 365/184 |
| 4,742,491 A | 5/1988 | Liang et al. | 365/185.29 |
| 4,769,340 A | 9/1988 | Chang et al. | 438/257 |
| 4,780,424 A | 10/1988 | Holler et al. | 438/262 |
| 4,847,808 A | 7/1989 | Kobatake | 365/104 |
| 4,870,470 A | 9/1989 | Bass, Jr. et al. | 257/324 |
| 4,941,028 A | 7/1990 | Chen et al. | 257/322 |
| 5,021,999 A | 6/1991 | Kohda et al. | 365/185.03 |
| 5,075,245 A | 12/1991 | Woo et al. | 438/262 |
| 5,104,819 A | 4/1992 | Freiberger et al. | 505/231 |
| 5,159,570 A | 10/1992 | Mitchell et al. | 365/185.03 |
| 5,168,334 A | 12/1992 | Mitchell et al. | 257/324 |
| 5,175,120 A | 12/1992 | Lee | 438/201 |
| 5,214,303 A | 5/1993 | Aoki | 257/390 |
| 5,260,593 A | 11/1993 | Lee | |
| 5,305,262 A | 4/1994 | Yoneda | 365/189.05 |
| 5,311,049 A | 5/1994 | Tsuruta | 257/324 |
| 5,324,675 A | 6/1994 | Hayabuchi | 438/591 |
| 5,349,221 A | 9/1994 | Shimoji | 257/324 |
| 5,350,710 A | 9/1994 | Hong et al. | 438/467 |
| 5,359,554 A | 10/1994 | Odake et al. | 315/184 |
| 5,393,701 A | 2/1995 | Ko et al. | 438/612 |
| 5,394,355 A | 2/1995 | Uramoto et al. | 365/104 |
| 5,414,693 A | 5/1995 | Ma et al. | 365/185.1 |
| 5,418,176 A | 5/1995 | Yang et al. | 438/262 |
| 5,418,743 A | 5/1995 | Tomioka et al. | 365/185.03 |
| 5,422,844 A | 6/1995 | Wolstenholme et al. | |
| 5,424,567 A | 6/1995 | Chen | 257/315 |
| 5,426,605 A | 6/1995 | Van Berkel et al. | 365/182 |
| 5,434,825 A | 7/1995 | Harari | 365/185.24 |
| 5,436,481 A | 7/1995 | Egawa et al. | 257/324 |
| 5,455,793 A | 10/1995 | Am in et al. | 365/185.26 |
| 5,467,308 A | 11/1995 | Chang et al. | 365/185.01 |
| 5,477,499 A | 12/1995 | Van Buskirk et al. | 365/185.3 |
| 5,496,753 A | 3/1996 | Sakurai et al. | 438/591 |
| 5,518,942 A | 5/1996 | Shrivasta | 438/264 |
| 5,523,251 A | 6/1996 | Hong | 438/278 |
| 5,553,018 A | 9/1996 | Wang et al. | 365/185.01 |
| 5,599,727 A | 2/1997 | Hakozaki et al. | 438/261 |
| 8,905,286 | 7/1997 | Eitan | 257/314 |
| 5,654,568 A | 8/1997 | Nakao | 257/324 |
| 5,656,513 A | 8/1997 | Wang at al. | 438/262 |
| 5,712,814 A | 1/1998 | Fratin et al. | 365/182 |
| 5,726,946 A | 3/1998 | Yamagata et al. | 365/226 |
| 5,751,037 A | 5/1998 | Aozasa et al. | 257/315 |
| 9,082,280 | 5/1998 | Eitan | 257/316 |
| 5,760,445 A | 6/1998 | Diaz | 257/356 |
| 5,768,192 A | 6/1998 | Eitan | 365/185.24 |
| 5,787,036 A | 7/1998 | Okazawa | 365/185.18 |
| 5,793,079 A | 8/1998 | Georgescu et al. | 257/316 |
| 5,801,076 A | 9/1998 | Ghniem et al. | 438/261 |
| 5,812,449 A | 9/1998 | Song | 365/185.03 |
| 5,825,686 A | 10/1998 | Schmitt-Landsiedel | 365/185.03 |
| 5,836,772 A | 11/1998 | Chang et al. | 438/261 |
| 5,841,700 A | 11/1998 | Chang | 365/185.18 |
| 5,847,441 A | 12/1998 | Cutter et al. | 257/530 |
| 5,864,164 A | 1/1999 | Wen | 257/390 |
| 5,870,335 A | 2/1999 | Khan et al. | 365/185.18 |
| 5,903,031 A | 5/1999 | Yamada et al. | 257/356 |
| 9,348,720 | 7/1999 | Eitan | 365/63 |
| 5,946,558 A | 8/1999 | Hsu | 438/130 |
| 5,963,412 A | 10/1999 | En | 361/111 |
| 5,973,373 A | 10/1999 | Krautschneider et al. | 257/390 |
| 9,413,408 | 10/1999 | Eitan | 257/316 |
| 5,991,202 A | 11/1999 | Derhacobian et al. | 365/185.19 |
| 6,011,725 A | 1/2000 | Eitan | 365/185.33 |
| 6,018,186 A | 1/2000 | Hsu | 257/390 |
| 6,020,241 A | 2/2000 | You et al. | 438/278 |
| 6,028,324 A | 2/2000 | Su et al. | 257/48 |
| 6,030,871 A | 2/2000 | Eitan | 438/276 |
| 6,034,403 A | 3/2000 | Wu | 257/390 |
| 6,034,896 A | 3/2000 | Ranaweera et al. | 365/185.28 |
| 6,063,666 A | 5/2000 | Chang et al. | 438/261 |
| 8,902,890 | 5/2000 | Eitan | 257/390 |
| 6,133,095 A * | 10/2000 | Eitan et al. | 438/261 |
| 6,137,718 A | 10/2000 | Reisinger | 365/185.03 |
| 6,181,597 B1 * | 1/2001 | Nachumovsky | 365/185.03 |
| 6,201,282 B1 | 3/2001 | Eitan | 257/390 |
| 6,208,557 B1 * | 3/2001 | Bergemont et al. | 365/185.15 |
| 6,215,702 B1 * | 4/2001 | Derhacobian et al. | 365/185.29 |

OTHER PUBLICATIONS

J.–D. Bude and M.R. Pinto, "Modeling Nonequilibrium Hot Carrier Device Effects", Conference of Insulator Specialists of Europe, Sweden, Jun. 1997.

Chan et al,. "A True Single–Transistor Oxide–Nitride–Oxide EEPROM Device," *IEEE Electron Device Letters*, vol. EDL–8, No. 3, Mar. 1987.

Change, J., "Non Volatile Semiconductor Memory Devices," *Proceedings of the IEEE*, vol. 64 No. 7, issued Jul. 1976.

Etian et al., "Hot–Electron Injection into the Oxide in n–Channel MOS Devices," *IEEE Transactions on Electron Devices*, vol. ED–38, No. 3, pp. 328–340, Mar. 1981.

Glasser et al., "The Design and Analysis of VLSI Circuits," Addison Wesley Publishing Co, Chapter 2, 1988.

Lee, H., "A New Approach For the Floating–Gate Mos NonVolatile Memory", *Applied Physics Letters*, vol. 31, No. 7, pp. 475–6, Oct. 1977.

Ma et al., "A dual–bit Split–Gate EEPROM (DSG) Cell in Contactless Array for Single–Vcc High Density Flash Memories," *IEEE*, pp. 3.5.1–3.5.4, 1994.

Oshima et al., "Process and Device Technologies for 16Mbit Eproms with Large–Tilt–Angle implanted P–Pocket Cell," *IEEE*, CH2865–4/90/0000–00095, pp. 5.2.1–5.2.4, 1990.

Ricco, Bruno, "Nonvolatile Multilevel Memories for Digital Application," *IEEE*, vol. 86, No. 12, pp. 2399–2421, issued 1998.

Roy, Anariban "Characterization and Modeling of Charge Trapping and Retention in Novel Multi–Dielectic Nonvolatile Semiconductor Memory Device," Doctoral Dissertation, Sherman Fairchild Center, Department of Computer Science and Electrical Engineering, pp. 1–35, 1989.

"2 Bit/Cell EEPROM Cell using Band–to–Band Tunneling For Data Read–Out," *IBM Technical Disclosure Bulletin*, U.S. IBM Corp. NY vol. 35, No. 4B, ISSN:0018–8689, Sep., 1992.

Hsing–Haung Tsent et al. "Thin CVD Gate Dielectric for ULSI Technology", *IEEE*, 0–7803–1450–6, 1993.

Pickar, K.A., "Ion Implantation in Silicon," *Applied Solid State Science*, vol. 5, R. Wolfe Edition, Academic Press, New York, 1975.

Bhattacharyya et al., "FET Gate Structure for Nonvolatile N–Channel Read–Mostly Memory Device," *IBM Technical Disclosure Bulletin*, U.S. IBM Corp. vol.18, No. 6, p. 1768, 1976.

\* cited by examiner

NROM CELL WITH GENERALLY DECOUPLED PRIMARY AND SECONDARY INJECTION

CROSS-REFERENCE TO RELATED APPLICATIONS

This application is related to U.S. Serial No. 60/161,596 filed Oct. 26, 1999 and entitled "Secondary Injection and Cycling", which application is incorporated herein by reference.

FIELD OF THE INVENTION

The present invention relates to FLASH, electrically erasable, programmable read only memory (EEPROM) and nitride, programmable read only memory (NROM) cells in general and to secondary injection therein in particular.

BACKGROUND OF THE INVENTION

Floating gate memory cells are used for electrically erasable, programmable read only memory (EEPROM) and Flash EEPROM cells. As shown in FIG. 1 to which reference is now made, floating gate cells comprise source and drain portions 102 and 104 embedded in a substrate 105, between which is a channel 100. A floating gate 101 is located above but insulated from channel 100 and a gate 112 is located above but insulated from floating gate 101.

For most floating gate cells, the standard electron injection mechanism (for programming) is channel hot electron injection, in which the source to drain potential drop creates lateral field that accelerates channel electrons $e_1$ from source 102 to drain 104. This is indicated by arrow 10. Near drain 104, a vertical field created by the gate voltage allows hot channel electrons $e_1$ to be injected (arrow 12) into floating gate 101.

There is another injection mechanism, known as "secondary electron injection". As indicated by arrow 14, some of the channel electrons $e_1$ create hole and electron pairs through ionization of valence electrons in channel 100 or drain 104. The probability of the ionization is labeled $M_1$ and it indicates the ratio between the channel current and the hole substrate current.

Due to the positive potential of drain 104, generated electron $e_2$ is collected (arrow 16) by drain 104. However, as indicated by arrow 18, hole $h_2$ accelerates towards the low substrate potential of substrate 105. On the way, another impact ionization event may occur, creating another electron-hole pair $e_3$-$h_3$, with probability $M_2$. Hole $h_3$ is pulled (arrow 20) further into substrate 105 and is of no concern. However, electron $e_3$ (known as the "secondary electron") is accelerated (arrow 22) toward positive gate 112 where, if it has gained sufficient energy, it is injected into floating gate 101. The probability of this occurring is labeled T.

The current for secondary injection is defined as:

$$I_g = I_{ds} * M_1 * M_2 * T$$

where $I_{ds}$ is the channel current from source to drain.

Because this current is significant, some floating gate devices have been built to enhance it, thereby reducing programming time and programming voltages. The following articles discuss some possible methods to enhance the secondary injection:

J. D. Bude, et al., "Secondary Electron Flash—a High Performance, Low Power Flash Technology for 0.35 μm and Below", IEDM 97, pp. 279–282;

J. D. Bude, et al., "EEPROM/Flash Sub 3.0V Drain-Source Bias Hot Carrier Writing", IEDM 95, pp. 989–992; and J. D. Bude and M. R. Pinto, "Modeling Nonequilibrium Hot Carrier Device Effects", *Conference of Insulator Specialists of Europe*, Sweden, June 1997. These references enhance the secondary generation and injection in two ways as shown in FIGS. 2A and 2B to which reference is now made, by implanting (FIG. 2A) substrate 105 with Boron pockets 116 and by applying a negative substrate bias $V_B$ to substrate 105 (FIG. 2B).

Boron pockets 116 (FIG. 2A), when implanted with relatively high energy, enhance the field in the substrate and hence, enhance the probability $M_2$ of secondary generation. This higher Boron concentration is effective also in accelerating secondary electrons and hence, enhances their probability T of injection.

The potential drop $V_{db}$ from drain 104 to substrate 105 is larger by 1V than the potential drop $V_{ds}$ from drain to source due the built-in potential in the n+/p− substrate junction. This enhances both the probability $M_2$ of a secondary impact and the probability T of injection. To further enhance secondary injection, a negative substrate bias $V_B$ can be applied, as shown in FIG. 2B.

It will be appreciated that the energy balance for secondary injection is a function of the drain voltage $V_d$ (which defines the voltage in the channel), the built-in potential $V_{bi}$, the substrate voltage $V_{sub}$ and the energy $De_{sec}$ after impact ionization. This compares to the primary electron injection mechanism (of channel hot electron injection) which is a function of the drain to source voltage $V_{ds}$.

Typically, if the drain to source voltage $V_{ds}$ is of 3V and the substrate voltage is at 0V, the primary electrons are accelerated by 3V while the secondary electrons are accelerated by 4V. If the substrate voltage is decreased to −1V, then the secondary electrons are accelerated by 5V. Thus, applying negative voltage to the substrate increases the secondary injection mechanism. This is illustrated in FIG. 2B which shows the potential energy across channel 100 (from drain 104 (at point A) to source 102 (point B) and into the substrate 105 (point C is at the electrode of substrate voltage $V_b$). In FIG. 2B, the drain/source voltage $V_{ds}$ is 3V, the gate/source voltage $V_{gs}$ is 2V and the channel length is 0.25 μm.

The solid line, labeled 120, indicates the potential energy in a standard situation where source/substrate voltage $V_{bs}$ is 0.0V. The potential energy drops from drain 104 to source 102 and then increases into substrate 105. Thus, the total potential drop from drain (point A) to substrate (point C) is about 1 eV higher than that of the drain to source (point A to point B). A generated hole $h_2$ will escape the drain 104 and will create a secondary electron $e_3$ with energy of about 0.2–0.7 eV.

This energy, when combined with the acceleration of secondary electron $e_3$ over several volts of substrate to channel potential towards gate 112, makes the probability of injection T of secondary electron $e_3$ higher than that of primary electron $e_1$. However, there are many more primary electrons $e_1$ available than secondary electrons $e_3$ and thus, most of the injection remains the primary electrons $e_1$. Since the injected electrons (primary and secondary) spread out in floating gate 101, there is no way to tell where injection occurred.

When the source/substrate voltage $V_{bs}$ is decreased to −1.0V, shown with the dashed line 122, the potential energy into substrate 105 increases, although the potential energy in the drain and across the channel does not change. The increased substrate potential provides additional energy to secondary electrons $e_3$ while not affecting the energy of channel electrons $e_1$.

Secondary injection adds to the primary injection mechanism to provide a faster and/or lower voltage injection into a floating gate cell. Unfortunately, secondary injection is not good for all types of cells. There are some cells, such as nitride, programmable read only memory (NROM) cells, for which enhancing secondary injection appears not to enhance the operation of the cell.

NROM cells are described in Applicant's copending U.S. patent application Ser. No. 08/905,286, entitled "Two Bit Non-Volatile Electrically Erasable And Programmable Semiconductor Memory Cell Utilizing Asymmetrical Charge Trapping" which was filed Aug. 1, 1997. The disclosure of the above-identified application is incorporated herein by reference.

FIGS. 3A, 3B and 3C, to which reference is now made, schematically illustrate the dual bit NROM cell. Similar to the floating gate cell of FIG. 1, the NROM cell has channel 100 between two bit lines 102 and 104 but, unlike the floating gate cell, the NROM cell has two separated and separately chargeable areas 106 and 108. Each area defines one bit. For the dual bit cell of FIGS. 3, the separately chargeable areas 106 and 108 are found within a nitride layer 110 formed in an oxide-nitride-oxide (ONO) sandwich (layers 109, 110 and 111) underneath gate 112.

To read the left bit, stored in area 106, right bit line 104 is the drain and left bit line 102 is the source. This is known as the "read through" direction, indicated by arrow 113. To read the right bit, stored in area 108, the cell is read in the opposite direction (a "reverse read"), indicated by arrow 114. Thus, left bit line 102 is the drain and right bit line 104 is the source.

FIG. 3B generally indicates what occurs within the cell during reading of the left bit of area 106. An analogous operation occurs, when reading the right bit of area 108.

To read the left bit in area 106, the left bit line 102 receives the source voltage level $V_s$, typically on the order of 0V, and the right bit line 104 receives the drain voltage $V_d$, typically of 1–2V. The gate 112 receives a relatively low voltage $V_g$, which typically is a low voltage of 2.5–3V.

The presence of the gate and drain voltages $V_g$ and $V_d$, respectively, induce a depletion layer 54 and an inversion layer 52 in the center of channel 100. The drain voltage $V_d$ is large enough to induce a depletion region 55 near drain 104 which extends to the depletion layer 54 of channel 100. This is known as "barrier lowering" and it causes "punch-through" of electrons from the inversion layer 52 to the drain 104. The punch-through current is only minimally controlled by the presence of charge in right area 108 and thus, the left bit can be read irrespective of the presence or absence of charge in right area 108.

Since area 106 is near left bit line 102 which, for this case, acts as the source (i.e. low voltage level), the charge state of area 106 will determine whether or not the inversion layer 52 is extended to the source 102. If electrons are trapped in left area 106, then the voltage thereacross will not be sufficient to extend inversion layer 52 to the source 102 and a "0" will be read. The opposite is true if area 106 has no charge.

For NROM cells, each bit is programmed in the direction opposite that of its reading direction. Thus, to program left bit in area 106, left bit line 102 receives the high programming voltage (i.e. is the drain) and right bit line 104 is grounded (i.e. is the source). This is shown in FIG. 3C. The opposite is true for programming area 108.

The bits are erased in the same directions that they are programmed. However, for erasure, a negative erasure voltage is provided to the gate 112 and a positive voltage is provided to the bit line which is to be the drain. Thus, to erase the charge in left area 106, the erase voltage is provided to left bit line 102. The highly negative erase voltage creates holes in the n+ junction (near left bit line 102) through band-to-band tunneling. These holes are accelerated by the lateral field near the drain (left bit line 102) and the ONO surface. Some holes gain enough energy to be injected through the bottom oxide 109 in a process known as "tunnel assisted hot hole injection".

Typically, programming and erasure are performed with pulses of voltage on the drain and on the gate. After each pulse, a verify operation occurs in which the threshold voltage level of the cell (i.e. the gate voltage level at which the cell becomes significantly conductive) is measured. During programming, the threshold voltage level Vtp is steadily increased until the cell will not pass any significant current during a read operation. During erasure, the opposite is true; the threshold voltage level Vte is decreased until a significant current is present in the cell during reading. Should the cell not meet the erase specification (typically defined by a maximum number of pulses to achieve erasure), it is no longer considered functional.

The enhancements for secondary injection are indirectly implemented in the NROM cell as well. In some arrays, the NROM cell has an inherent back bias, due to voltage drops in the array. This results in a positive source voltage $V_s$, which requires a higher drain voltage $V_d$ to meet the required drain-to-source voltage $V_{ds}$, for a desired programming speed. As discussed hereinabove with respect to FIG. 2, the increased drain voltage $V_d$ enhances the secondary injection since the drain to bulk potential is increased accordingly. And, since the source voltage $V_d$ is more positive than desired, the drain-to-source voltage $V_{ds}$ is lower than desired which, in turn, reduces the drive for the primary injection mechanism. Unfortunately, as indicated in FIGS. 4A and 4B to which reference is now made, the secondary injection effect degrades the operation of the NROM cell.

FIGS. 4A and 4B illustrate the results of an experiment where one of the bits was programmed and then erased, once with substrate 105 at 0V and once with substrate 105 at −2V. The remaining voltages stayed the same. If programming occurred properly, then the programmed bit should change threshold voltage during programming, while the unprogrammed bit should not change at all. If programming occurred properly, then during erasure, the threshold voltage of the programmed bit should quickly return to the unprogrammed level.

In FIG. 4A, the threshold voltage is graphed against the programming time. Programming ends when the threshold level of the bit being programmed has increased by 2.0V.

Curves 134 and 136 show the results for programming with the standard source/substrate voltage $V_{sb}$ of 0.0V, for the bit being programmed and the unprogrammed bit, respectively. As can be seen in curve 134, the threshold level of the bit being programmed increases steadily until, at 100 μsec, the bit reaches the programmed level. At the same time, the voltage level of the unprogrammed bit increases to slightly above 0.2V (curve 136).

Curves 138 and 140 show the results for programming with the negative source/substrate voltage $V_{sb}$ of −2V, for the bit being programmed and the unprogrammed bit, respectively. In curve 138, the threshold level of the bit being programmed increases faster and becomes programmed by 10 μsec. At the same time, the voltage level of the unprogrammed bit (curve 140) grows to 0.5V. This threshold level reduces the operating window for two bits. In other words, the punchthrough read of one bit is affected by the information in the other bit.

In FIG. 4B, the threshold voltage is graphed against the erase time. Curves 144 and 146 show the results for erasure of the bit programmed with the standard source/substrate voltage $V_{sb}$ of 0.0V, for the programmed and unprogrammed bits, respectively. The threshold level of the programmed bit drops sharply (curve 144) until, at 1.0 sec, the bit is unprogrammed. At the same time, the voltage level of the unprogrammed bit drops back to 0.0V (curve 146).

Curves 148 and 150 show the results for erasure of the bit programmed with the negative source/substrate voltage $V_{sb}$ of −2V, for the programmed and unprogrammed bits, respectively. The unprogrammed bit is further erased, back to almost 0.0V However, the programmed bit erases slowly and still has a significant threshold voltage level even after 1.0 sec of erasure.

Thus, using a negative substrate voltage $V_B$, whether to solve a back bias or to enhance secondary injection for NROM cells, does not improve their performance. To the contrary, it greatly degrades their performance. Similarly, adding a pocket implant improves their primary performance but may adversely affect their endurance by enhancing the secondary injection.

U.S. Ser. Nos. 09/082,280 and 09/413,408, assigned to the common assignees of the present invention and incorporated herein by reference, describe using pocket implants, such as enhance primary injection, in an NROM cell to shape the lateral field such that charge is injected in an area from which it can be erased. This dramatically improves the operation of the cell with respect to the primary injection.

SUMMARY OF THE INVENTION

Applicant has realized that the secondary injection reduces the performance of NROM cells. Furthermore, as will be described in more detail hereinbelow, Applicant has realized that the cause is the secondary electrons s that are injected far from the bit line junctions. These secondary electrons are not removable during erasure and thus, reduce the ability of the NROM cell to separate between the two charge areas.

Therefore, the present invention seeks to decouple the primary injection mechanism from other injection mechanisms, like the secondary one, enhancing the primary mechanism while reducing the other injection mechanisms.

There is therefore provided, in accordance with a preferred embodiment of the present invention, a method of creating a nitride, programmable read only memory (NROM) cell includes the step of decoupling injection of channel hot electrons into a charge trapping layer of the NROM cell from injection of non-channel electrons into the charge trapping layer . The step of decoupling can include the step of minimizing the injection of the non-channel electrons into the charge trapping layer. Alternatively, it includes the step of minimizing the generation of the non-channel electrons.

Additionally, in accordance with a preferred embodiment of the present invention, the step of injection minimization includes at least one of the following steps: minimizing the concentration of Boron deep in the substrate, implanting a shallow threshold voltage implant, implanting deep bit lines and making the channel to be shorter than a standard length.

Furthermore, in accordance with a preferred embodiment of the present invention, the NROM cell has at least one Boron pocket implants and the step of Boron concentration reduction includes the step of implanting Arsenic or Phosphorous pocket implants deeper than the Boron pocket implants.

Still further, in accordance with a preferred embodiment of the present invention, the threshold voltage implant step includes the step of implanting two threshold voltage implants, a first surface implant of Boron and a second deeper implant of Arsenic or Phosphorous. Additionally, Boron pockets can be implanted.

Additionally, in accordance with a preferred embodiment of the present invention, the step of generation minimization includes at least one of the following steps: minimizing the concentration of Boron deep in the substrate, implanting a shallow threshold voltage implant and making the channel to be shorter than a standard length.

Alternatively, in accordance with a preferred embodiment of the present invention, the NROM cell can include a shallow threshold voltage implant at least of Boron into the channel. The concentration of the Boron is reduced by a factor of 2 at least a distance of 10–20, 20–30, 30–40 and 50–100 nm from a surface of the channel.

Moreover, in accordance with a preferred embodiment of the present invention, the shallow threshold implant has a first implant of Boron and a counterdoping implant of one of Arsenic and Phosphorous, wherein the counterdoping implant is deeper in the channel than the first implant.

Further in accordance with a preferred embodiment of the present invention, the cell also includes a pocket implant near at least one of the bit lines.

In accordance with a further preferred embodiment of the present invention, the NROM cell can include a double pocket implant near at least one of the bit lines wherein the double pocket implant is formed of two pocket implants, a p+ implant near a surface of the substrate and an n− implant below the p+ implant.

In accordance with a still further preferred embodiment of the present invention, the NROM cell can include a substrate having two bit lines and a channel therebetween, wherein the channel is no longer than 0.2 $\mu$m, and an ONO layer at least above the channel.

Further, in accordance with a preferred embodiment of the present invention, the channel is no longer than 0.15 $\mu$m. Alternatively, it is no longer than 0.1 $\mu$m.

Moreover, in accordance with a preferred embodiment of the present invention, the NROM cell can include a substrate having two bit lines and a channel therebetween, wherein the bit lines have a depth of no less than 0.3 $\mu$m into the substrate, and an ONO layer at least above the channel.

There is also provided, in accordance with a preferred embodiment of the present invention, a method of creating nitride, programmable read only memory cell, the method comprising the steps of having a high ratio of surface injection to deep injection of electrons into a charge trapping layer of the NROM cell.

Moreover, in accordance with a preferred embodiment of the present invention, the NROM cell has at least Boron pocket implants and the method includes at least one of the following steps: implanting a shallow threshold voltage implant, implanting pocket implants of one of Arsenic and Phosphorous deeper than the Boron pocket implants or implanting two threshold voltage implants, a first surface implant of Boron and a second deeper implant of one of Arsenic and Phosphorous.

There is further provided, in accordance with a preferred embodiment of the present invention, a method of creating a nitride, programmable read only memory (NROM) cell, comprising the steps of generating a zero substrate potential at a distance no less than 45–55 nm into said substrate.

Additionally, in accordance with a preferred embodiment of the present invention, the step of generating includes the steps of minimizing the concentration of Boron deep in the substrate by implanting pocket implants of one of Arsenic and Phosphorous deeper than said Boron pocket implants, implanting two threshold voltage implants, a first surface implant of Boron and a second deeper implant of one of Arsenic and Phosphorous or implanting a shallow threshold voltage implant with or without Boron pockets.

Moreover, in accordance with a preferred embodiment of the present invention, the NROM cell has a channel and the step of generation includes the step of making the channel to be shorter than a standard length.

Finally, there is provided, in accordance with a preferred embodiment of the present invention, a method of operating a nitride, programmable read only memory (NROM) cell to have minimum injection from non-channel electrons. The cell has bit lines serving as source and drain to the cell and the method includes the step of providing the lowest source voltage Vs which provides a desired drain to source voltage $V_{ds}$ to the well.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Applicant has realized that secondary electrons that are injected far from the bit line junctions cause early failure of the NROM cells. As described hereinbelow with respect to FIGS. 5, these secondary electrons are not removable during erasure and thus, they reduce the ability of the NROM cell to withstand a large number of program and erase cycles.

Figure 1:
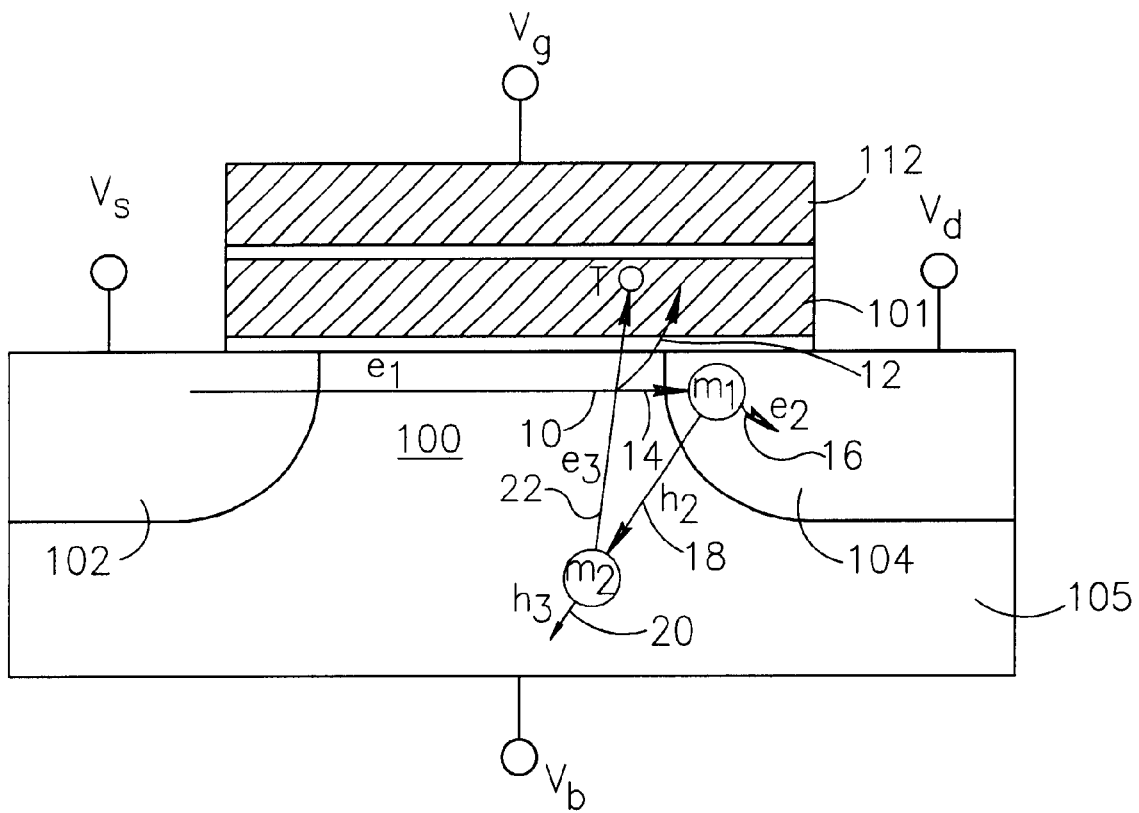
FIG. 1 is a schematic illustration of a secondary injection within a floating gate cell.
Figure 2A:
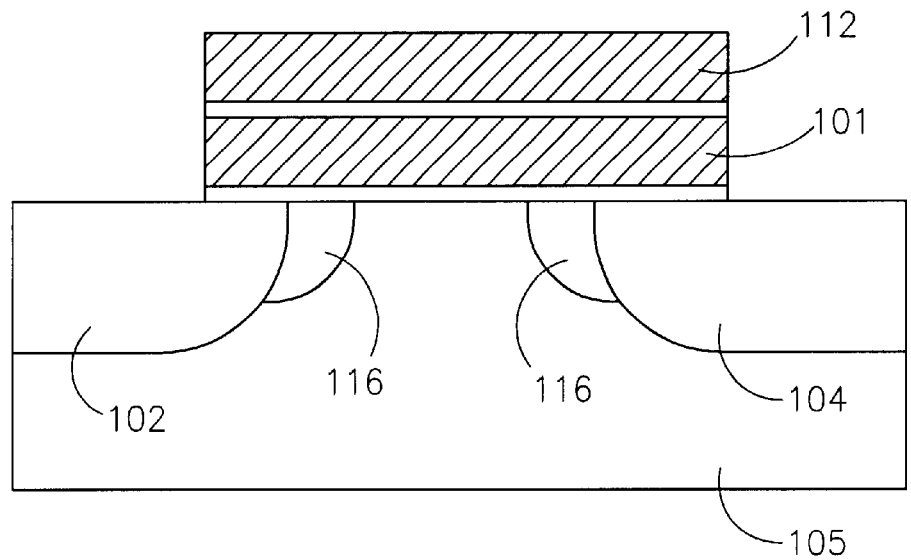
FIG. 2A is a schematic illustration of the cell of FIG. 1 with pocket implants.
Figure 2B:
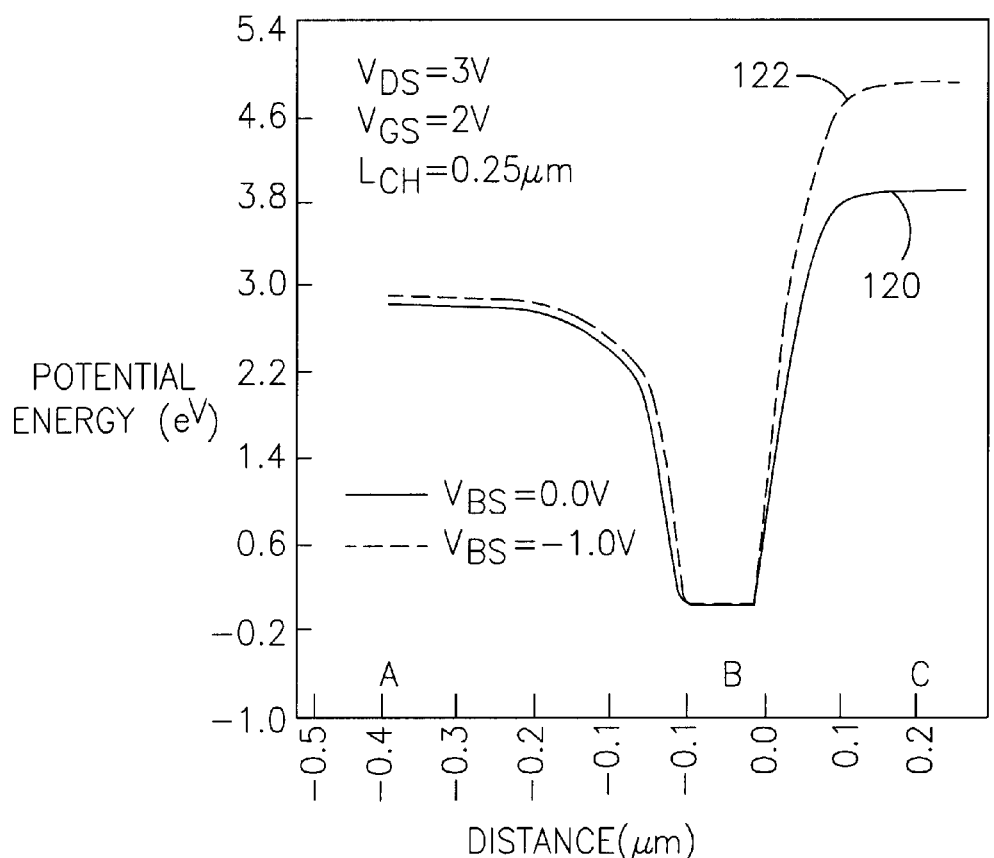
FIG. 2B is a graphical illustration of potential drops within the floating gate cell.
Figure 3A:
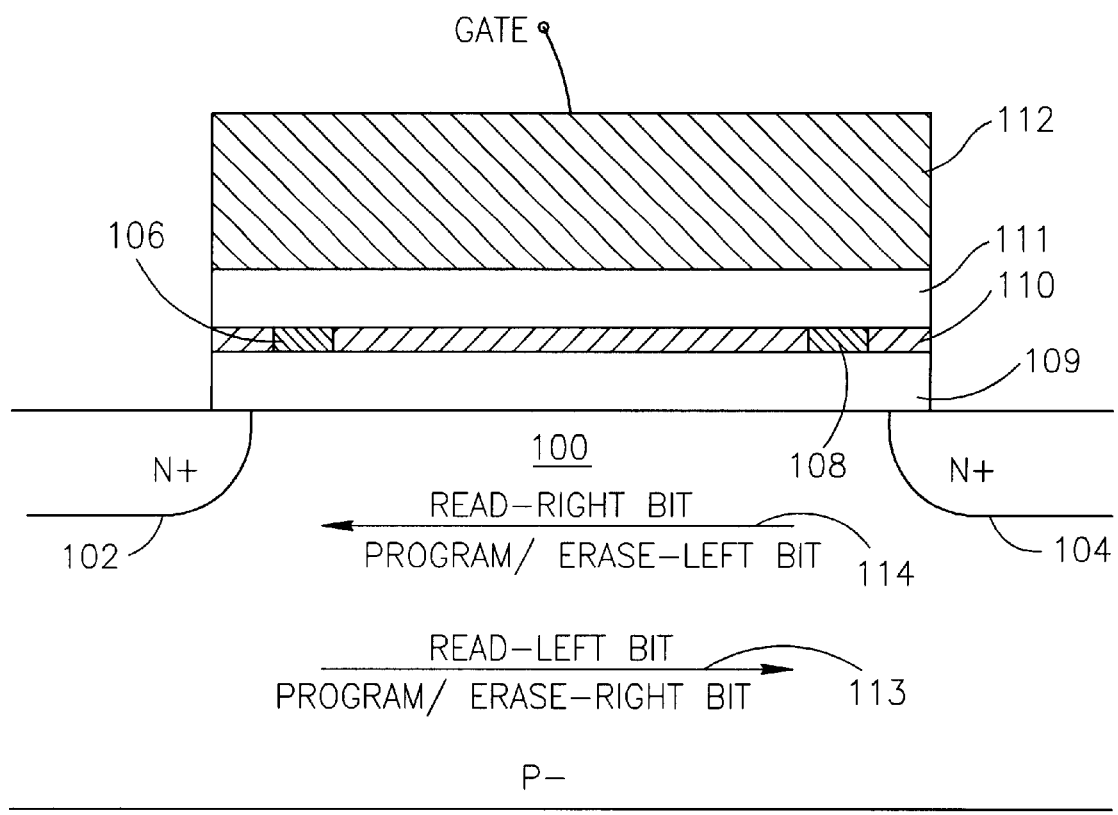
FIGS. 3A, 3B and 3C are schematic illustrations of the operation of a prior art dual bit, nitride programmable read only memory (NROM) cell.
Figure 3B:
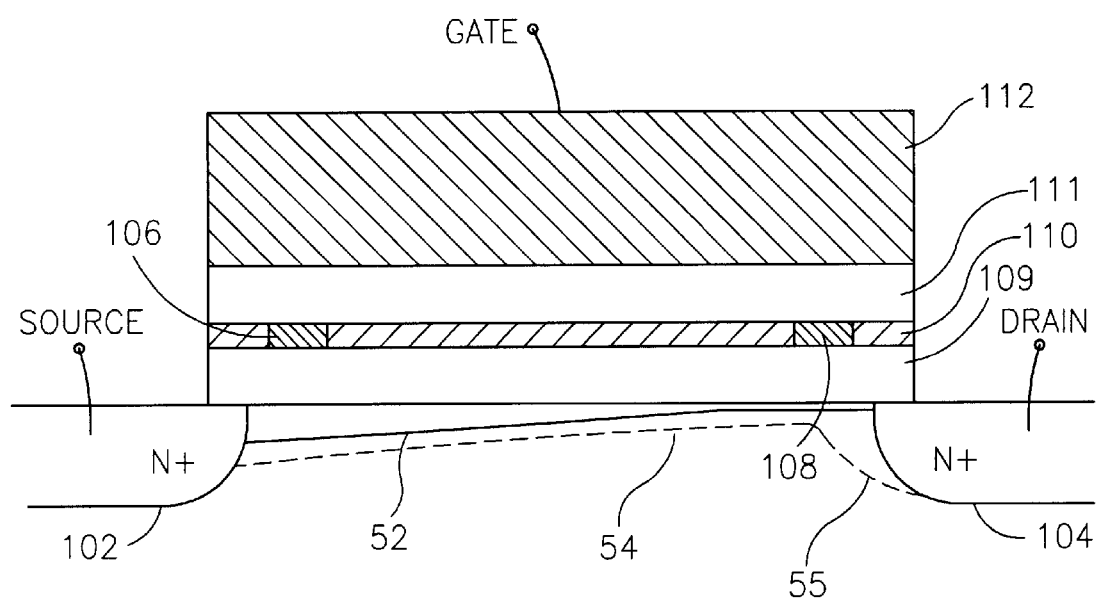
Figure 3C:
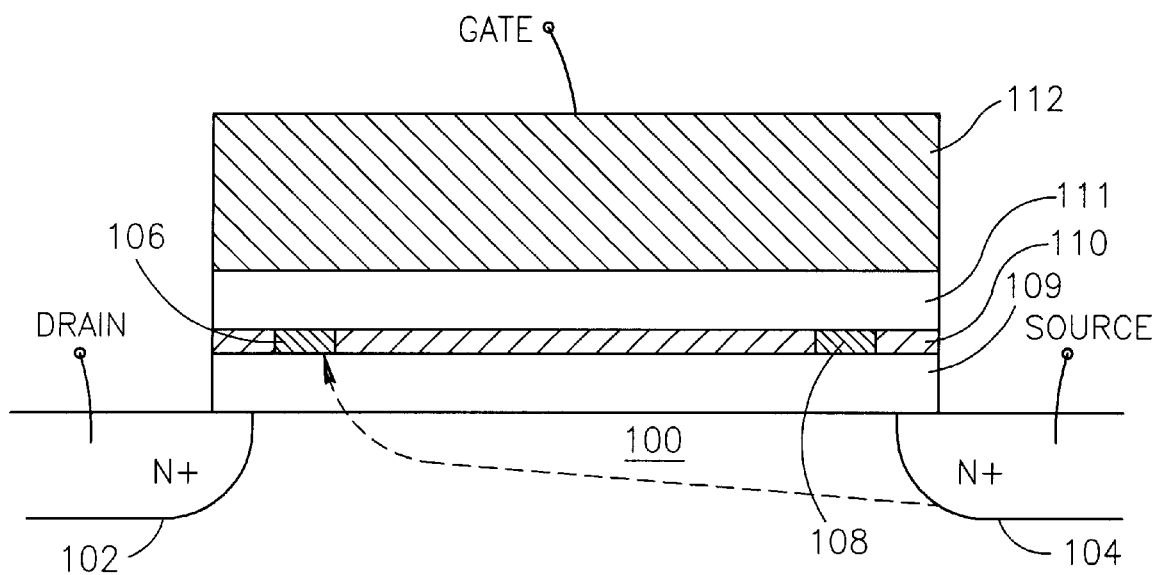

Reference is now made to FIGS. 5A, 5B, 5C and 5D, which show the charge stored in right area 108 (FIGS. 3) of the nitride layer as a function of distance along the channel for one cell. FIGS. 5 show only the charge over the channel region as this is the only charge which affects the threshold voltage $V_t$ of the device.

Figure 5A:
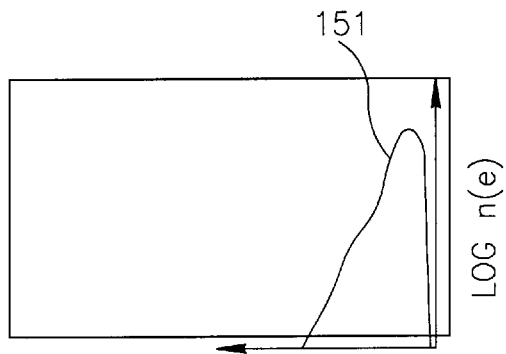
FIGS. 5A and 5B are schematic illustrations of the state of the NROM cell of the prior art after the first cycle of programming and erasure, respectively.
Figure 5B:
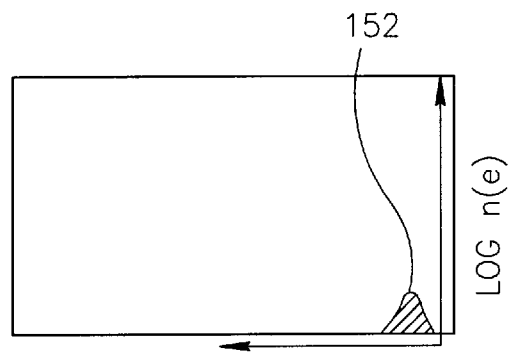

FIG. 5A shows that, after the first cycle of programming, a significant amount of charge, labeled 151, is stored close to the right bit line, which, in this example, is the drain for programming and erasure. As one moves away from the drain, the amount of charge reduces, eventually to zero. FIG. 5B shows the amount of charge, labeled 152, left after the first erase cycle. The erase electric field is typically so effective that it removes extra electrons (more than were present in charge 151) such that section 152 is positive while section 151 is negative. Section 152 is thus, hatched, to indicate that it is positively charged.

Figure 5C:
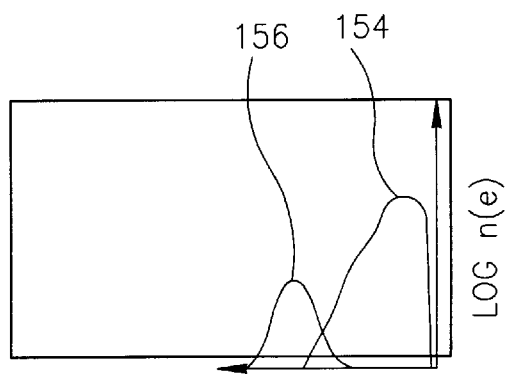
FIGS. 5C and 5D are schematic illustrations of the state of the NROM cell of the prior art after the 20,000$^{th}$ cycle of programming and erasure, respectively.
Figure 5D:
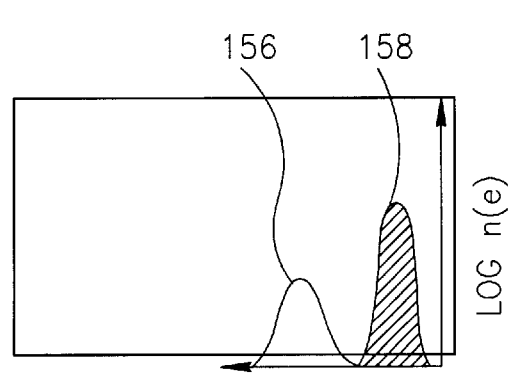

FIGS. 5C and 5D parallel FIGS. 5A and 5B, respectively, but for after 20,000 cycles. After programming, there is a significant charge, labeled 154, close to the drain, as in FIG. 5A but with less electrons. However, there is also another section of charge, labeled 156, further from the drain, which was injected far from the drain junction and was not erased during previous erase cycles. After the 20,000$^{th}$ erase cycle, extra section 156 still remains and is negatively charged, though the previously programmed section 154 has become positively charged section 158 (FIG. 5D).

As can be understood from the above discussion, the charge, in section 156, is not erased during erasure operations and remains trapped there. Trapped charge 156 acts as partially programmed charge. It is due to trapped charge 156 that, at the 20,000$^{th}$ cycle, fewer programming pulses are required to achieve the programmed threshold voltage level (since the bit is already, in effect, partially programmed).

Furthermore, the accumulation of trapped negative charge 156 far from the junction increases the threshold voltage level, which affects the reverse read. The erase operation compensates by accumulating extra positive charge (in the form of holes) close to the junction, which makes the erase time take longer. Another problem with hole compensation for non-erased charge is the large dipole field that exists between the hole and the electron distributions. Holes move toward electrons at high temperatures and recombine with the electrons during any retention bake. This movement of holes under high field and temperature into the channel reduces the programming threshold. In response, the programming threshold voltage $V_{tp}$ is increased to compensate. However, this, in turn, reduces the reliability margin of the part.

U.S. Ser. Nos. 09/082,280 and 09/413,408 attempt to solve the problem of trapped charge 156 for primary injection, but both can be further improved. U.S. Ser. No. 09/082,280 reduces the field far from the junctions and ensures that a high field is found near the bit line junction only. U.S. Ser. No. 09/413,408 self-aligns the areas of hot electron injection (programming) and hot hole injection (erasure). Both applications function to increase the primary, channel hot hole injection mechanism. However, as Applicant has realized, neither method is successful in resolving the above problem since neither method reduces the secondary injection mechanism.

The secondary injection mechanism causes some trapped charge 156 to be generated with each programming cycle. Even if most of the secondary electrons are removed with each cycle, over many cycles, there will be a slow increase in the size of remaining trapped charge 156, which, eventually, will degrade the cell.

As described in the Background, the NROM cell uses the punchthrough effect to read only one of the two bits. Punchthrough occurs under the bit not being read and is dependent on the width of the trapped charge. Punchthrough can only occur if the charged area is narrow. Thus, if the presence of remaining trapped charge 156 widens the total area of trapped charge, punchthrough will become less and less effective, until the erase state of the other bit cannot be recognized and the part will fail.

The present invention seeks to decouple the primary injection mechanism from the secondary one, emphasizing the primary mechanism while reducing the secondary one.

Applicant has realized that the secondary electrons are mainly produced deep in substrate 105 while primary electrons are produced near the surface of substrate 105. Therefore, in accordance with a preferred embodiment of the present invention, the two processes are decoupled, by affecting either the generation of the secondary electrons or by affecting the injection efficiency T. Another option is to enhance the primary injection while not enhancing the secondary injection. In other words, the present invention improves the ratio of the primary to secondary injections.

Figure 6A:
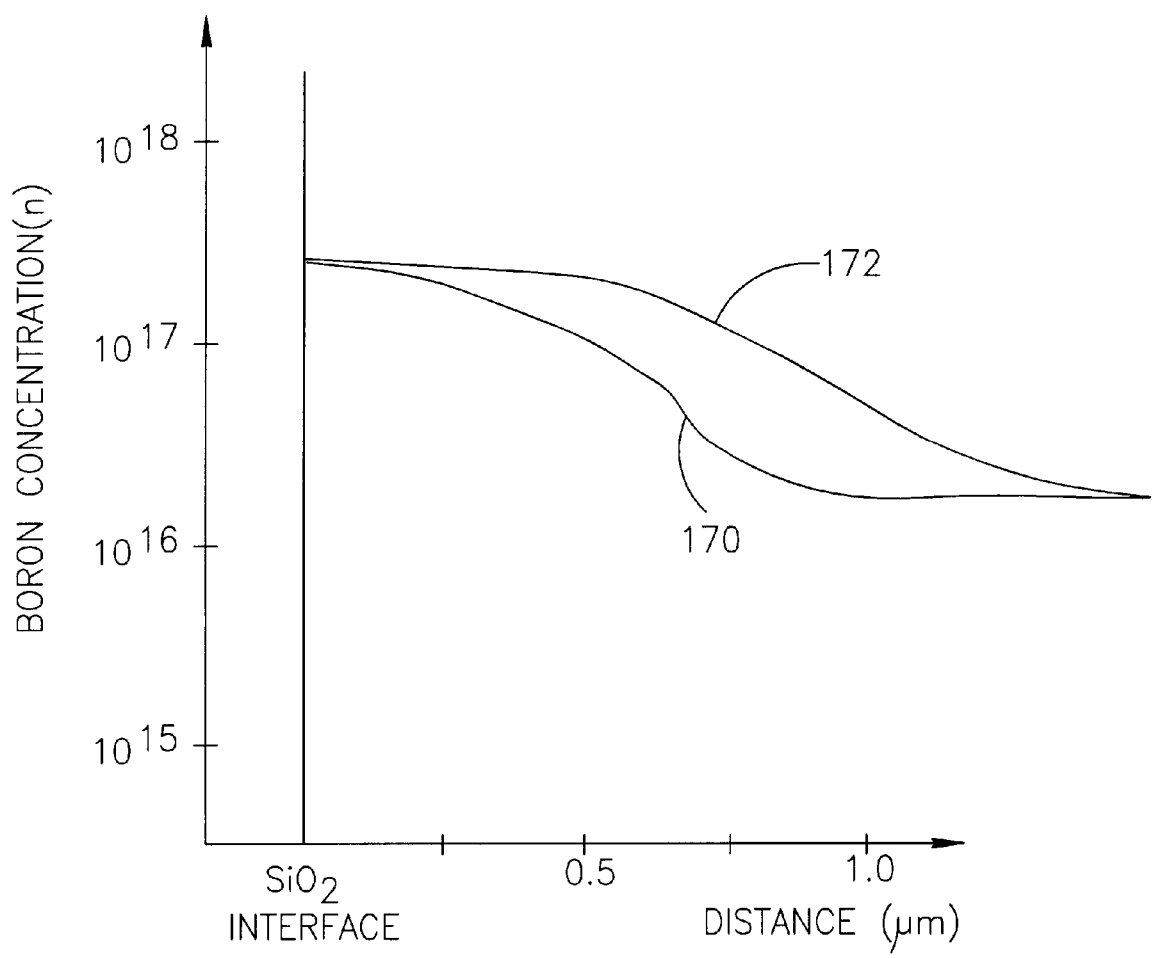
FIG. 6A is a graphical illustration of Boron concentration for a cell of the present invention and of the prior art.
Figure 6B:
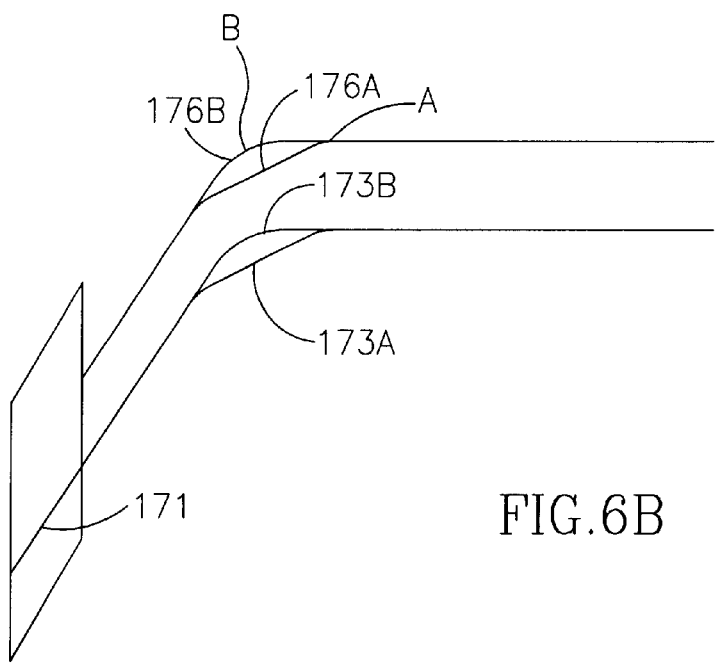
FIG. 6B is a band diagram illustration for the cells whose Boron concentrations are shown in FIG. 6A.
Figure 6C:
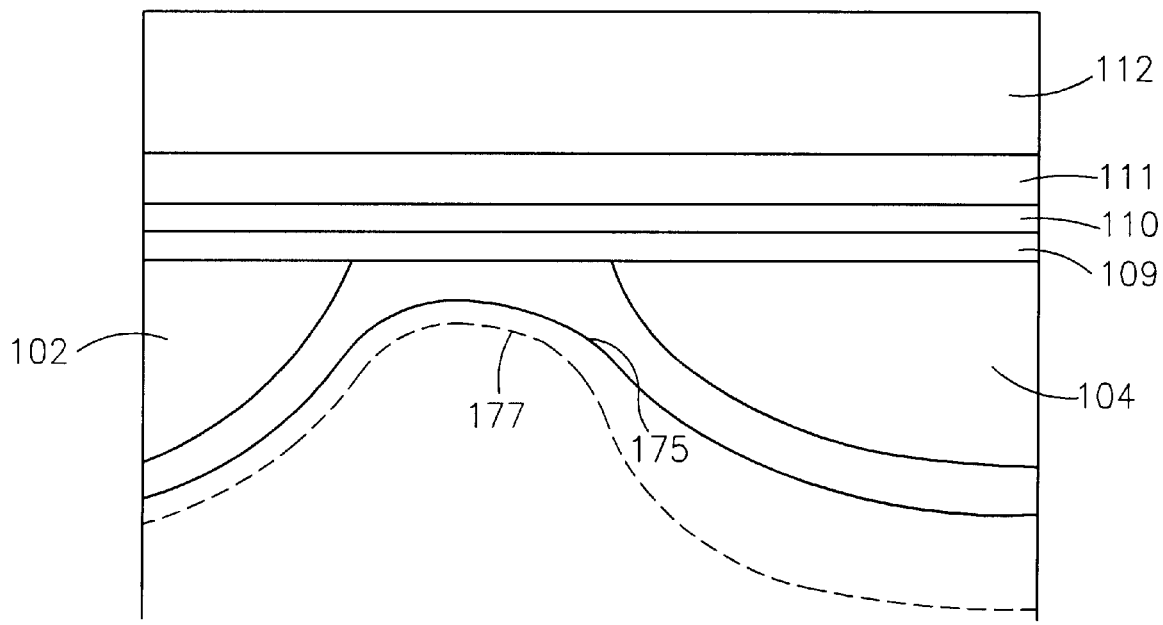
FIG. 6C is a schematic illustration of the depletion layers for the cells whose Boron concentrations are shown in FIG. 6A.
Figure 7A:
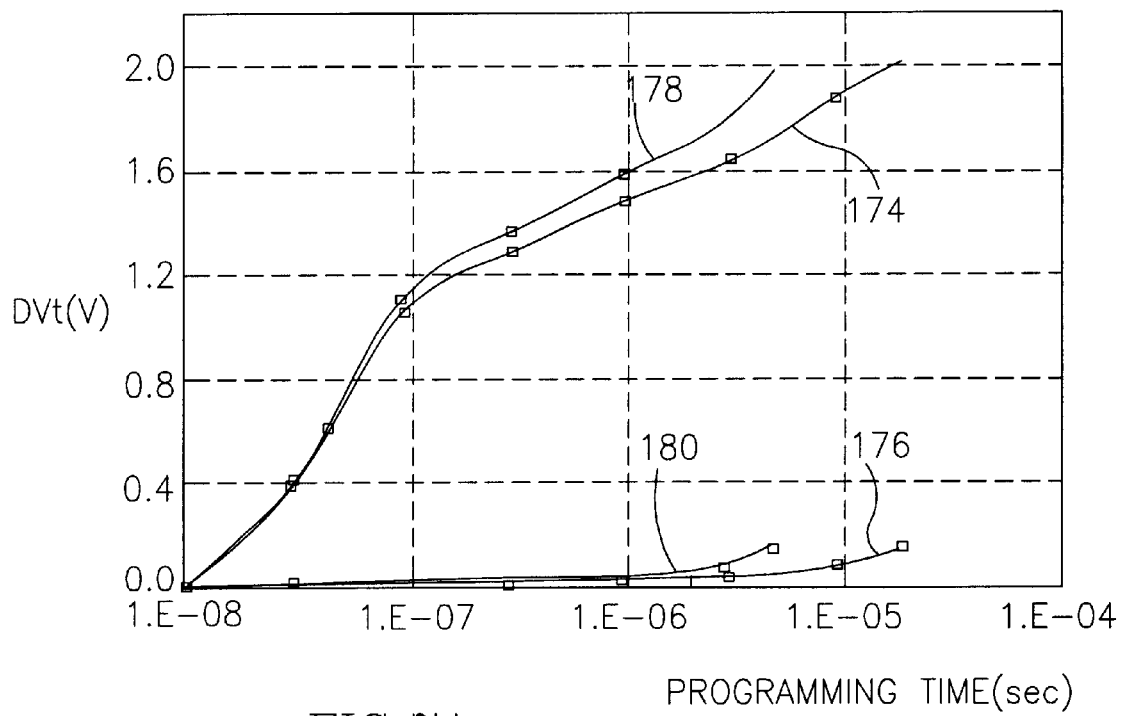
FIGS. 7A and 7B are graphical illustrations of the threshold voltage during programming and erasure, respectively, for the cells whose Boron concentrations are shown in FIG. 6A.
Figure 7B:
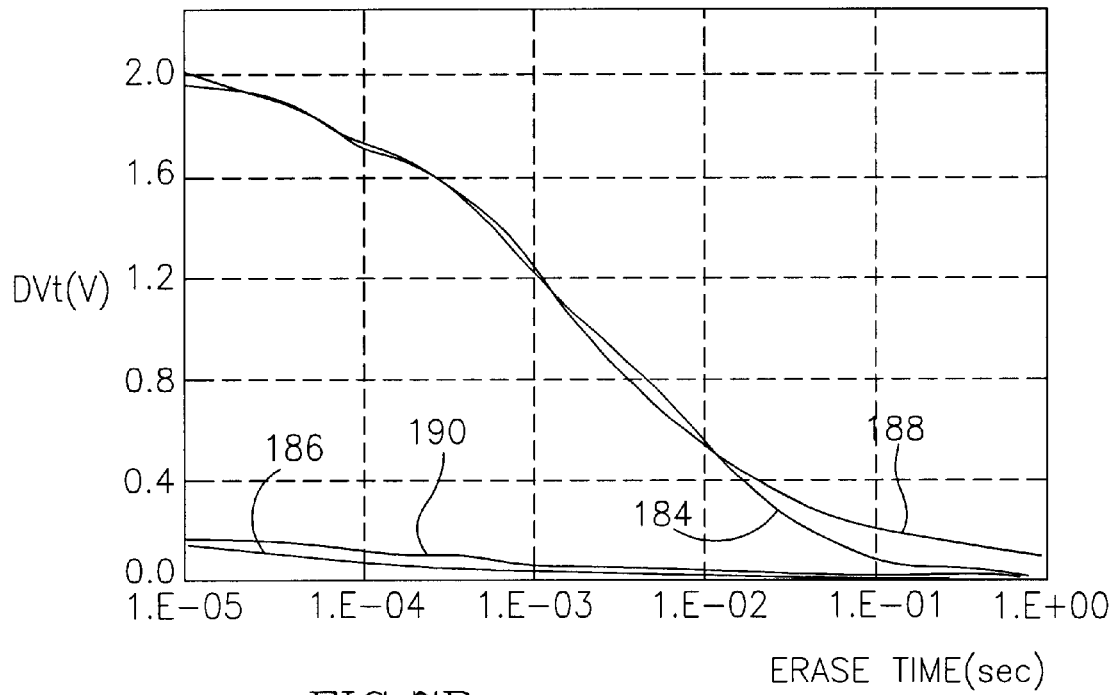

Reference is now made to FIGS. 6A, 6B and 6C, which illustrate the general principles of the present invention and to FIGS. 7A and 7B, which illustrate the results for the experiment discussed with respect to FIGS. 6A and 6B, but for an array of the present invention.

FIG. 6A is a graph of the Boron concentration into substrate 105. Two graphs 170 and 172 are shown which indicate the Boron concentration of the present invention and of a prior art cell having a standard pocket implant, respectively. For the present invention, (graph 170), the Boron concentration is significantly reduced at about 0.5 $\mu$m from the SiO$_2$ surface. Otherwise (graph 172), the Boron concentration decreases only further than 1 $\mu$m from the SiO$_2$ surface. With the present invention, fewer secondary electrons will be generated because there is little or no Boron in the areas where secondary electron generation occurs.

FIG. 6B is a band diagram corresponding to the Boron concentrations of FIG. 6A. FIG. 6B shows valence bands 173A and 173B and conduction bands 176A and 176B for the cell of the present invention vs. the prior art cell. As can be seen, the bands 173A and 176A for the present invention have lower slopes, far from surface 171, than do the bands 173B and 176B for the prior art. Since the slope of the bands indicates the fields found at those locations, it can be seen that, for the present invention, the fields are reduced deep into the substrate 105. Thus, there are lower fields in the areas where secondary electrons are produced and thus, the probability that secondary injection will occur has been reduced.

In effect, the substrate potential (the point where the substrate potential is 0V) has been moved further into the substrate. Point A, the substrate potential for the present invention, is farther from surface 171 than point B, the substrate potential for the prior art. This provides at least a three order of magnitude improvement in cycling.

FIG. 6C is an illustration of the depletion region of the cell for the prior art cell (solid line 175) and the present invention (dashed line 177). As can be seen, depletion region 177 is approximately the same as depletion region 175 in the channel but much deeper than depletion region 175 near drain 104. Since the strength of the vertical field is an inverse function of the distance of the edge of the depletion region from the drain, the vertical field deep in the substrate is much lower in the present invention than in the prior art.

Figure 4A:
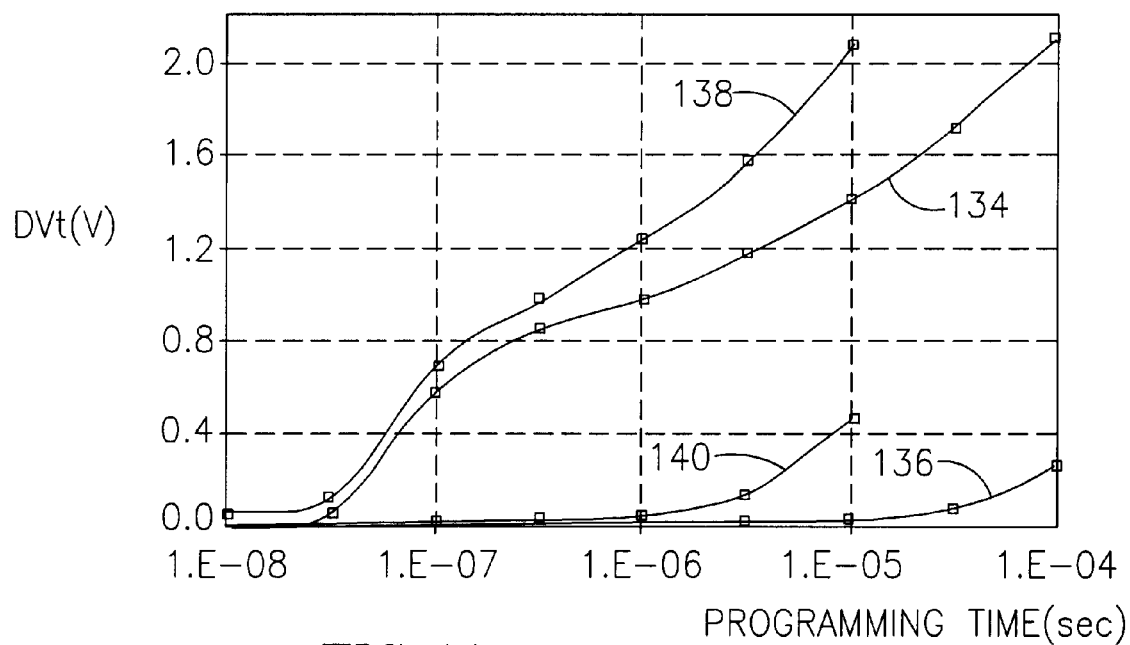
FIGS. 4A and 4B are graphical illustrations of the threshold voltage during programming and erasure, respectively, of the NROM cell.
Figure 4B:
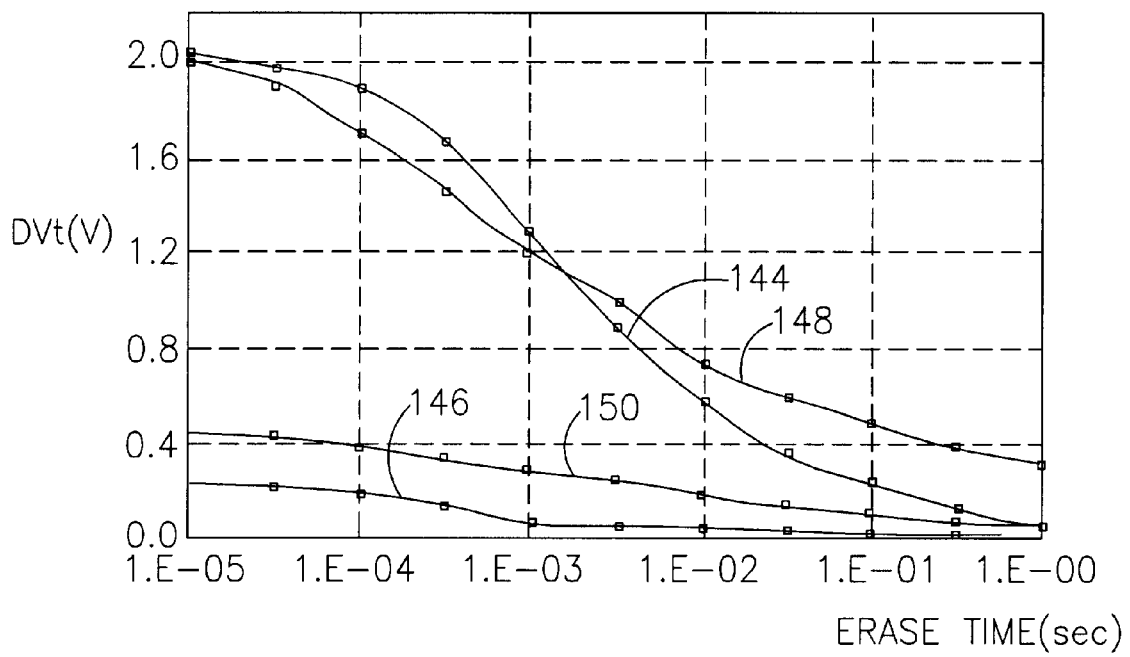

FIGS. 7A and 7B graph the threshold voltage during programming and erasure, respectively, for the experiment discussed with respect to FIGS. 4A and 4B but for an array of the present invention. Four curves are shown in each figure.

For FIG. 7A, curves 174 and 176 show the results for programming with the standard source/substrate voltage $V_{sb}$ of 0.0V, for the bit being programmed and the unprogrammed bit, respectively. Curves 178 and 180 show the results for programming with the reduced source/substrate voltage $V_{sb}$ of −2V, for the bit being programmed and the unprogrammed bit, respectively.

As can be seen in curve 174, programming is finished by 20 $\mu$sec, which is five times faster than the 100 $\mu$sec of curve 134 (FIG. 4A). Furthermore, the voltage level of the unprogrammed bit hardly increases (curve 176). With the negative source/substrate voltage $V_{sb}$, the bit being programmed (curve 178) becomes programmed by 5 $\mu$sec and, once again, the voltage level of the unprogrammed bit (curve 180) hardly increases. In other words, less far-from-the-junction secondary electrons are being injected.

In FIG. 7B, the threshold voltage is graphed against the erase time. Curves 184 and 186 show the results for erasure of the bit programmed with the standard source/substrate voltage $V_{sb}$ of 0.0V, for the programmed and unprogrammed bits, respectively, while curves 188 and 190 show the results for programming with the negative source/substrate voltage $V_{sb}$ of −2V. For both programmed bits (curves 188 and 184), the threshold voltage drops significantly such that, by 1 sec, both bits are erased. Similarly, the unprogrammed bits are slightly erased as well.

FIGS. 7A and 7B indicate that, with the reduced deep Boron concentration, the trapped charge 156 is sufficiently reduced such that the dual bit NROM cell operates as expected, with two, separately programmable and separately erasable bits.

Figure 8:
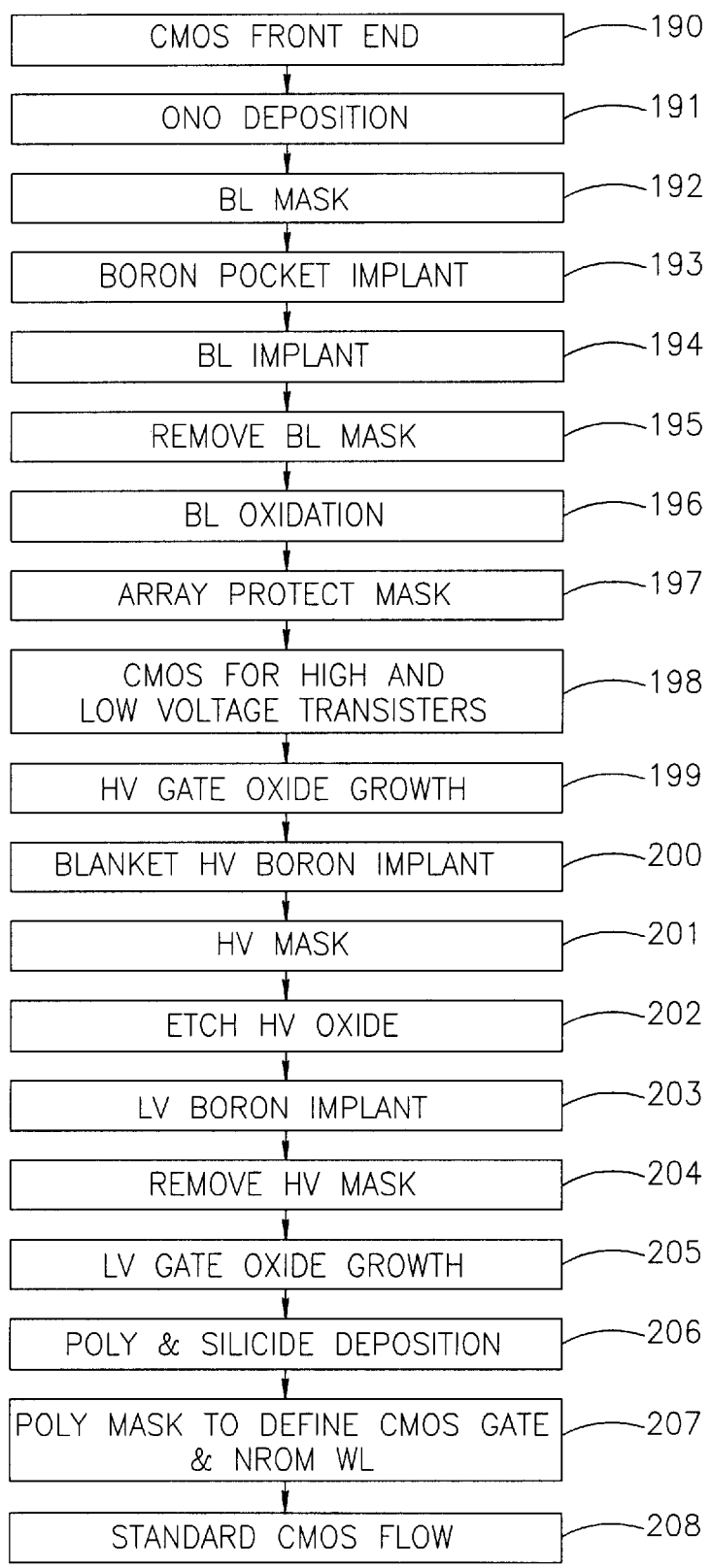
FIG. 8 is a flow chart illustration of a standard process for producing an NROM cell.

In the following, various embodiments of cells whose ratio of primary to secondary injection is improved are provided, as is one process flow for creating each embodiment. In order to understand the process flows, a general process flow is first provided, in FIG. 8, to which reference is now made.

The process is based on that described in U.S. Ser. No. 09/082,280 and will be provided here without significant explanation.

The process begins, in step 190, with the steps of a standard CMOS (complementary metal oxide semiconductor) front end, followed by deposition (step 191) of the ONO layer. The CMOS front end steps Include field isolation, sacrificial oxide and the n-channel and n-well implants. The ONO deposition is described in U.S. Ser. No. 09/082,280.

Step 192 is a bit line (BL) mask step in which the mask that defines the bit lines is laid down on substrate 105. The oxide and nitride layers are etched using this mask. The Boron is then implanted in two pocket implant steps (step 193), as described in U.S. Ser. No. 09/082,280, with angled implants, producing Boron pockets 116. The implant has a dosage of $1.5 \times 10^{13}$ per cm$^2$ at 60 Kev and at an angle of 25° to the right and left of vertical.

In step 194, the bit lines are implanted, with a dosage of $3 \times 10^{15}$ per cm$^2$ at 45 Kev and at an angle of 7° parallel to the bit line mask, after which, in step 195, the bit line mask is removed.

In step 196, the bit lines are oxidized, if desired, after which an array protect mask is laid down (step 197) and the ONO is removed from the periphery of the chip (i.e. from everywhere but the array). With the array protect mask in place, the standard CMOS operations for producing high and low voltage transistors in the periphery are performed (step 198).

A gate oxide, for the high voltage (HV) transistors, is now grown (step 199) after which, a threshold adjust implant, which is typically a blanket, high voltage boron implant, is performed (step 200).

A high voltage mask is laid down (step 201) and the high voltage oxide is etched (step 202). A low voltage Boron implant is performed (step 203) after which, the high voltage mask is removed (step 204). This is followed by a low voltage gate oxide growth (step 205) and a polysilicon and silicide deposition (step 206). A poly mask is laid down (207) to define the CMOS gates and the word lines of the array after which, the standard CMOS now is followed (step 208).

Figure 9:
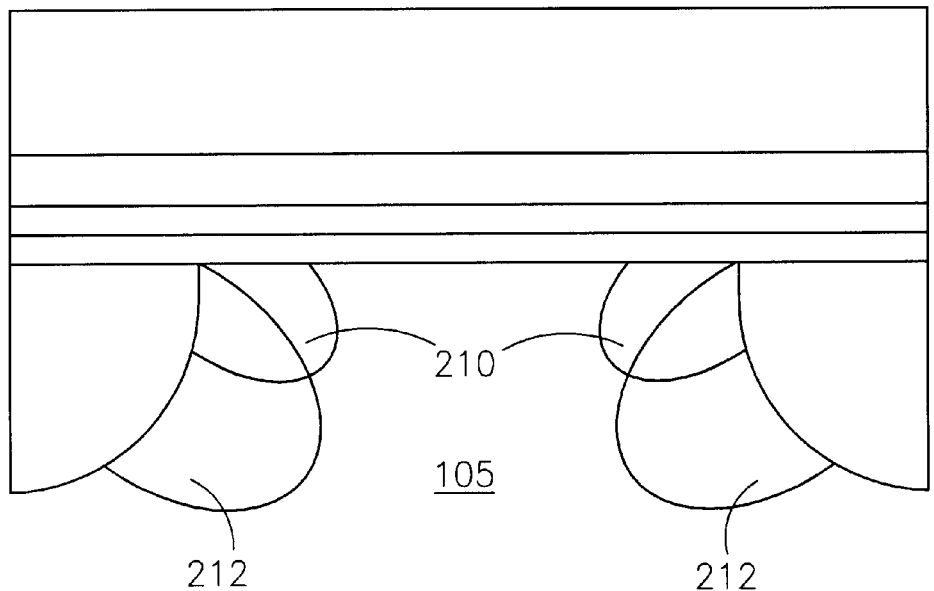
FIG. 9 is a schematic illustration of an NROM cell having a double pocket, where the second pocket implant reduces the depth of the first pocket implant.

In the first embodiment, the deep boron concentration is reduced by counter doping. In this embodiment, shown schematically in FIG. 9, to which reference is now made, a double pocket is produced with Boron (210) and Arsenic or Phosphorous (212). The process is similar to that shown in FIG. 8, except that there are two pocket implant steps. The Boron is implanted first, using the dosage, energy and angles described hereinabove, after which the Arsenic or Phosphorous is implanted. The dosage for the Arsenic is $5 \times 10^{13}$ per cm$^2$ at 180 Kev and at an angle of 15° to the right and left of vertical.

The Arsenic or Phosphorous, being n+, cancels the affect of the Boron (which is p−) deep in substrate 105. To aid the primary injection, the Boron remains present near the surface, but little Boron, if any, is present deep in substrate 105 where secondary electrons are produced.

Figure 10A:
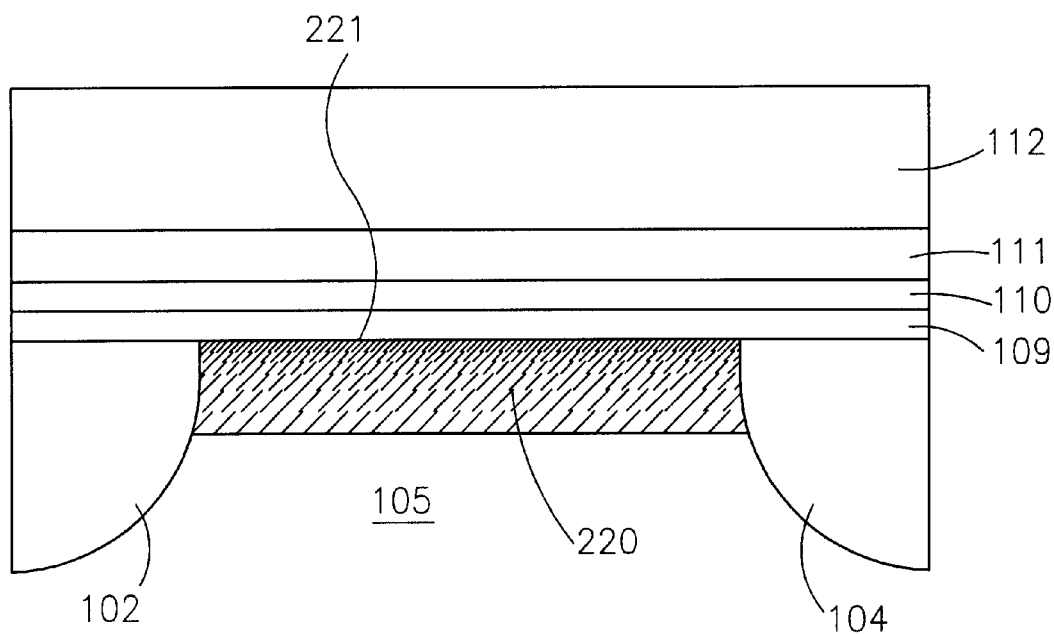
FIG. 10A is a schematic illustration of an NROM cell having a shallow threshold voltage implant.
Figure 10B:
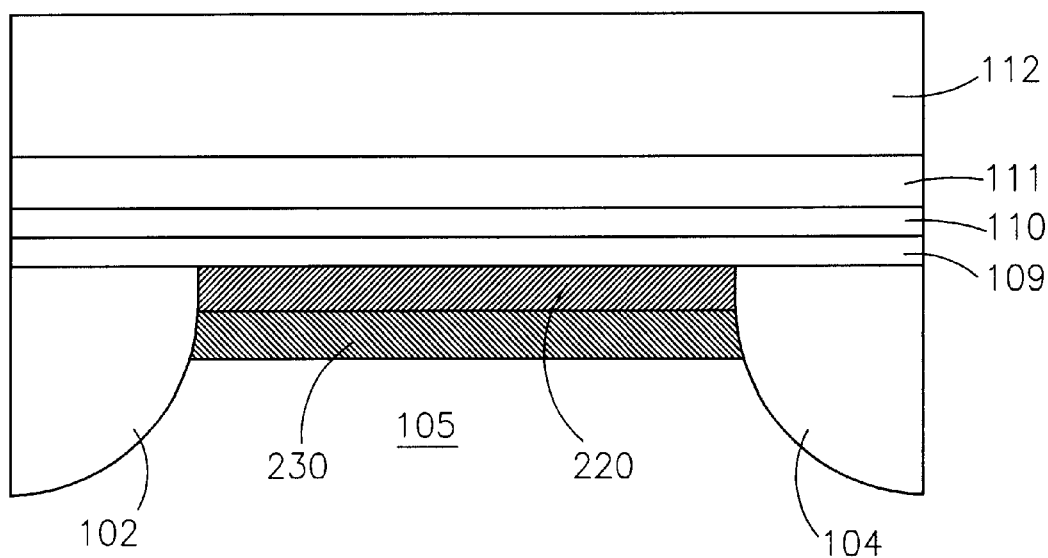
FIG. 10B is a schematic illustration of an NROM cell having a double threshold voltage implant.
Figure 10C:
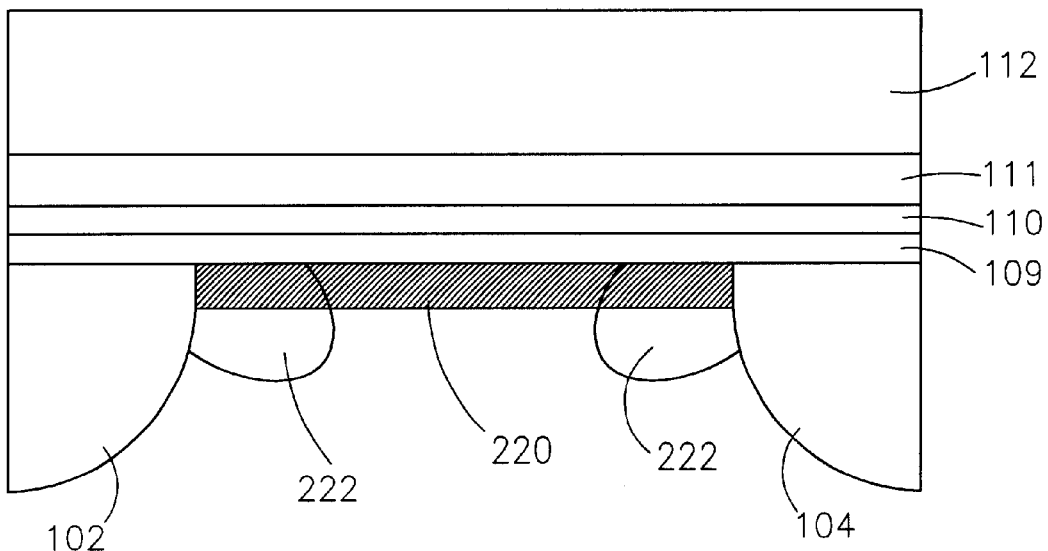
FIG. 10C is a schematic illustration of an NROM cell having a shallow threshold voltage implant and a pocket implant.

In an alternative embodiment, illustrated in FIGS. 10A, 10B and 10C to which reference is now made, the surface of the channel is enhanced. This improves the primary injection mechanism without improving the secondary injection mechanism. Thus, programming will take less time (due to the improved primary mechanism) and less secondary electrons will be injected. Furthermore, the deep Boron concentration is reduced with respect to the prior art.

The surface enhancement is provided, in FIG. 10A, by a shallow threshold voltage Vt implant 220 of Boron. The cell can be produced without a pocket (FIGS. 10A and 10B) or with a pocket (FIG. 10C). FIG. 10B shows a double threshold voltage implant. The remaining elements are the same as in previous embodiments.

Threshold voltage Vt implant 220 is produced after the low voltage gate oxide growth step (step 205). To create it, a shallow implant mask, defining the locations of implant 220, is first laid down, after which Boron of $3-5 \times 10^{12}$ per cm$^2$ at 25 Kev and at an angle of 7° parallel to the shallow implant mask is implanted. If the cell is produced without pockets (as in FIGS. 10A and 10B), then step 193 is not performed. Otherwise (for FIG. 10C), it is performed.

Threshold voltage Vt implant 220 is a shallow implant since it occurs at the end of the high temperature processes and thus, does not have much chance to diffuse into channel 100. The result is an implant that is more concentrated near a surface 221 of channel 100. The implant is less concentrated further into substrate 105. For example, the concentration is typically reduced by a factor of 2 at a distance of 50–100 nm from surface 221. It will be appreciated that the distance from surface 221 at which the Boron is significantly reduced is a function of the size of the cell and will be reduced as the cell gets smaller. Thus, shorter distances of even 10 nm are possible.

FIG. 10B illustrates an alternative version of this embodiment with two threshold voltage Vt implants. The first implant is a shallow implant of Boron, as in the previous embodiment. However, the second implant, labeled 230, is a deep implant of Arsenic or Phosphorous This counterdoping ensures that the Boron implant extends only to a known depth.

To manufacture such a cell, two implant operations occur using the shallow implant mask. The first implant is of Boron, as described hereinabove. The second implant, of Arsenic or Phosphorous, is of $1-1.5 \times 10^{12}$ per cm$^2$ at 90 Kev or 45 Kev, respectively, and at an angle of 7° parallel to the shallow implant mask.

A further embodiment, shown in FIG. 10C, adds Boron pockets 222 to shallow implant 220. In this embodiment, shallow implant 220 provides the desired surface concentration. Boron pockets 222 add to the surface concentration and provide Boron somewhat deeper into substrate 105. However, since shallow implant 220 provides the desired surface concentration, the Boron concentration can be reduced, to at least half that of the previous pockets. Thus, the deep concentration of Boron is minimal.

To produce the embodiment of FIG. 10C, the Boron pocket implants (step 193) are of $0.4-0.75 \times 10^{13}$ per cm$^2$ (as opposed to $1.5 \times 10^{13}$ per cm$^2$) at 60 Kev and at an angle of 25° to the right and left of vertical. The shallow implant 220 (after step 206) is Boron of $1-2.5 \times 10^{12}$ per cm$^2$ (as opposed to the $3-5 \times 10^{12}$ per cm$^2$ of previous embodiments) at 25 Kev and at an angle of 7° parallel to the shallow implant mask.

Figure 11A:
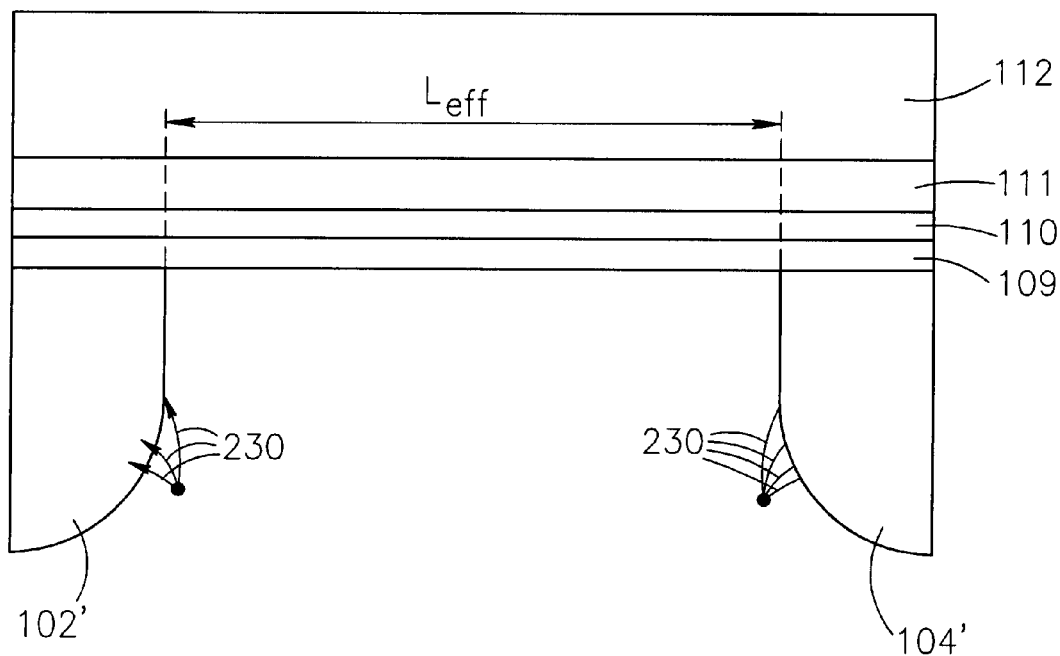
FIGS. 11A and 11B are schematic illustrations of an NROM cell having deep junctions and a short channel length, respectively.
Figure 11B:
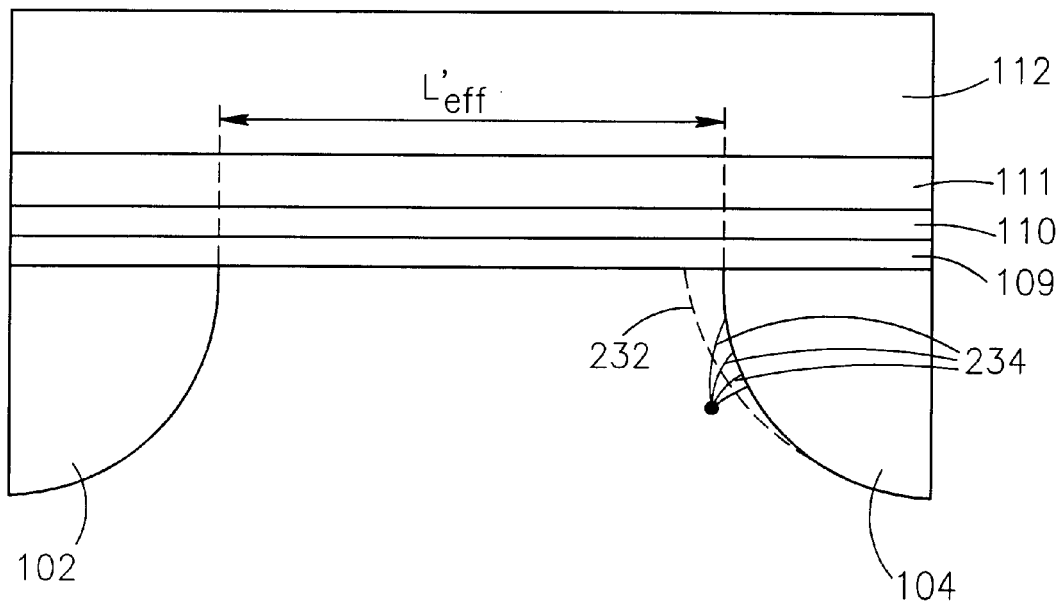

Reference is now made to FIGS. 11A and 11B, which illustrate further embodiments of the present invention having a deeper junction and a shorter channel length $L_{\mathit{eff}}$, respectively. Both features can be implemented separately, if desired or in combination.

In FIG. 11A, the bit lines, here labeled 102' and 104', are shown extending further into substrate 105 than in the previous embodiments. This can be produced through longer oxidation periods, during which the bit lines diffuse into substrate 105 in all directions. This includes diffusing toward each other and deeper into substrate 105.

It will be appreciated the deeper junctions of FIG. 11A collect most of the secondary electrons before they get to the surface. This is indicated by arrows 230. Thus, fewer secondary electrons will be injected into nitride layer 110.

In FIG. 11B, the channel width, marked by $L'_{\mathit{eff}}$, is shorter than it is in the previous embodiments (it is marked in FIG.

11A by $L_{eff}$). A shorter channel has a larger lateral field, for the same drain to source voltage $V_{ds}$, and thus, the primary injection is increased, without increasing the secondary generation. Alternatively, for the same lateral field, the drain to source voltage $V_{ds}$ can be reduced. The primary injection remains the same but the secondary generation is reduced.

Furthermore, a depletion region, such as the one marked 232, around the drain 104 further reduces the size of the channel during programming or reading. Most of the secondary electrons will be injected into drain 104 or its depletion region 232, as indicated by arrows 234, rather than into nitride layer 110. Thus, the shorter channel reduces the probability T of injection into nitride layer 110.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

It will be appreciated by persons skilled in the art that the present invention is not limited by what has been particularly shown and described herein above. Rather the scope of the invention is defined by the claims that follow.

What is claimed is:

1. A method of creating a nitride, programmable read only memo (NROM) cell, the method comprising the step of:
   decoupling injection of channel hot electrons into a charge trapping layer of said NROM cell from injection of non-channel electrons into said charge trapping layer.

2. A method according to claim 1 wherein said step of decoupling includes the step of minimizing the injection of said non-channel electrons into said charge trapping layer.

3. A method according to claim 2 wherein said step of injection minimization includes the step of minimizing the concentration of Boron deep in the substrate.

4. A method according to claim 3 wherein said NROM cell has at least Boron pocket implants and wherein said step of Boron concentration minimization includes the step of implanting pocket implants of one of Arsenic and Phosphorous deeper than said Boron pocket implants.

5. A method according to claim 2 and wherein said step of injection minimization includes the step of implanting a shallow threshold voltage implant.

6. A method according to claim 5 and wherein said threshold voltage implant step includes the step of implanting two threshold voltage implants, a first surface implant of Boron and a second deeper implant of one of Arsenic and Phosphorous.

7. A method according to claim 5 and including the step of implanting Boron pockets.

8. A method according to claim 2 and wherein said step of injection minimization includes the step of implanting deep bit lines.

9. A method according to claim 2 wherein said NROM cell has a channel and wherein said step of injection minimization includes the step of making said channel to be shorter than a standard length.

10. A method according to claim 9 and wherein said step of injection minimization also includes the step of implanting deep bit lines.

11. A method according to claim 1 wherein said step of decoupling includes the step of minimizing the generation of said non-channel electrons.

12. A method according to claim 11 wherein said step of generation minimization includes the step of minimizing the concentration of Boron deep in the substrate.

13. A method according to claim 12 wherein said NROM cell has at least Boron pocket implants and wherein said step of Boron concentration minimization includes the step of implanting pocket implants of one of Arsenic and Phosphorous deeper than said Boron pocket implants.

14. A method according to claim 11 and wherein said step of generation minimization includes the step of implanting a shallow threshold voltage implant.

15. A method according to claim 14 and wherein said threshold voltage implant step includes the step of implanting two threshold voltage implants, a first surface implant of Boron and a second deeper implant of one of Arsenic and Phosphorous.

16. A method according to claim 14 and including the step of implanting Boron pockets.

17. A method according to claim 11 wherein said NROM cell has a channel and wherein said step of generation minimization includes the step of making said channel to be shorter than a standard length.

18. A method of creating a nitride, programmable read only memory (NROM) cell, the method comprising the step of:
   having a high ratio of surface injection to deep injection of electrons into a charge trapping layer of said NROM cell.

19. A method according to claim 18 wherein said NROM cell has at least Boron pocket implants and wherein said step of having includes the step of implanting pocket implants of one of Arsenic and Phosphorous deeper than said Boron pocket implants.

20. A method according to claim 18 and wherein said step of having includes the step of implanting a shallow threshold voltage implant.

21. A method according to claim 20 and wherein said threshold voltage implant step includes the step of implanting two threshold voltage implants, a first surface implant of Boron and a second deeper implant of one of Arsenic and Phosphorous.

22. A method according to claim 20 and including the step of implanting Boron pockets.

23. A method of creating a nitride, programmable read only memory (NROM) cell, the method comprising the step of:
   generating a zero substrate potential at a distance no less than 45–55 nm into said substrate.

24. A method according to claim 23 wherein said step of generation includes the step of minimizing the concentration of Boron deep in the substrate.

25. A method according to claim 24, wherein said NROM cell has at least Boron pocket implants and wherein said step of Boron concentration minimization includes the step of implanting pocket implants of one of Arsenic and Phosphorous deeper than said Boron pocket implants.

26. A method according to claim 23 and wherein said step of generation includes the step of implanting a shallow threshold voltage implant.

27. A method according to claim 26 and wherein said threshold voltage implant step includes the step of implanting two threshold voltage implants, a first surface implant of Boron and a second deeper implant of one of Arsenic and Phosphorous.

28. A method according to claim 26 and including the step of implanting Boron pockets.

29. A method according to claim 23 wherein said NROM cell has a channel and wherein said step of generation includes the step of making said channel to be shorter than a standard length.

30. A method of operating a nitride, programmable read only memory (NROM) cell to have minimum injection from non-channel electrons, the cell having bit lines serving as source and drain to said cell, the method comprising the step of:

providing the lowest source voltage Vs which provides a desired drain to source voltage $V_{ds}$ to said cell.

* * * * *